(12) United States Patent
Hicks et al.

(10) Patent No.: US 7,183,776 B1
(45) Date of Patent: Feb. 27, 2007

(54) SYSTEM AND METHOD FOR PERFORMING ONLINE PARTIAL DISCHARGE TESTING

(75) Inventors: Clarence A. Hicks, Avondale, AZ (US); Wallace Vahlstrom, Pleasanton, CA (US)

(73) Assignee: Electrical Reliability Services, Inc., San Ramon, CA (US)

( * ) Notice: Subject to any disclaimer, the term of this patent is extended or adjusted under 35 U.S.C. 154(b) by 0 days.

(21) Appl. No.: 11/217,065

(22) Filed: Aug. 31, 2005

(51) Int. Cl.
*H01H 31/12* (2006.01)
*G01R 31/08* (2006.01)

(52) U.S. Cl. ...................... 324/551; 324/536
(58) Field of Classification Search ............... 324/536
See application file for complete search history.

(56) References Cited

U.S. PATENT DOCUMENTS 5,075,629 A * 12/1991 Umemura et al. ......... 324/547
5,726,576 A * 3/1998 Miyata et al. ............. 324/536
2005/0012507 A1* 1/2005 Kaneda et al. ............. 324/536

OTHER PUBLICATIONS

Practical application of on-line partial discharge monitoring techniques on 500KV Shunt Reactors. Xiiith International Symposium on high voltage engiineering, Netherlands 2003, Smit (ed.) Copy right 2003 Milpress, Rotterdam. ISBN 90-77017-79-8.*
On-Site Partial discharge monitoring using the differential LEMKE PROBE LDP-5 and its accessories/ HV Testing, Monitoring and Diagnostics workshop. Workshop 2000, Alexandria, Virginia Sep. 13&14, 2000.*

* cited by examiner

*Primary Examiner*—Vincent Q. Nguyen
(74) *Attorney, Agent, or Firm*—Kinney & Lange, P.A.

(57) ABSTRACT

A partial discharge sensing system and method for conducting testing inside an enclosure includes a partial discharge sensor, an access port, and a signal cable. The partial discharge sensor is permanently installed at a test location inside the enclosure. The access port is configured so that an analyzer can be connected to the access port from an exterior of the enclosure. The signal cable operably connects the partial discharge sensor and the access port to enable an analyzer connected to the access port from outside the enclosure to interface with the partial discharge sensor for generating test data.

9 Claims, 2 Drawing Sheets

SYSTEM AND METHOD FOR PERFORMING ONLINE PARTIAL DISCHARGE TESTING

BACKGROUND OF THE INVENTION

The present invention relates to partial discharge sensing systems. More particularly, the present invention relates to an online partial discharge sensing system that includes a partial discharge sensor and an access port.

Partial discharge sensing can be used to assess the condition of power cables. More particularly, partial discharge sensing can be used to detect deterioration of insulation of power cables by detecting high frequency currents that are created by small gaps, voids or other deterioration in power cable insulation. Online partial discharge sensing refers to frequency domain testing conducted on objects that remain energized during testing.

Typically, a partial discharge sensing system includes a partial discharge sensor, a spectrum analyzer, and a signal cable for carrying electrical signals between the sensor and the spectrum analyzer. In order to conduct a partial discharge test, an operator positions the sensor at a test location on a power cable. Known systems utilize split core sensors, which require the operator to clamp the split core sensor around the power cable. Next, the operator manually conducts a partial discharge test using the spectrum analyzer.

In order to conduct testing on power cables that are located within enclosures, an operator must open the enclosure and position a partial discharge sensor on a power cable located inside. This requires that the operator be in close proximity to power cables and other components within the enclosure. This can present a safety hazard to operators, who risk electrical shock, electrocution, and other serious injury from equipment housed within such enclosures.

BRIEF SUMMARY OF THE INVENTION

The present invention provides a partial discharge sensing system and method that does not require an operator to open enclosures containing power cables to be tested. The partial discharge sensing system includes a partial discharge sensor, an access port, and a signal cable. Partial discharge sensors are permanently installed at a test location inside the enclosure. The access port is configured so that an analyzer can be connected to the access port from an exterior of the enclosure. The signal cable operably connects the partial discharge sensor and the access port to enable an analyzer connected to the access port from outside the enclosure to interface with the partial discharge sensor for generating test data.

DETAILED DESCRIPTION

Figure 1:
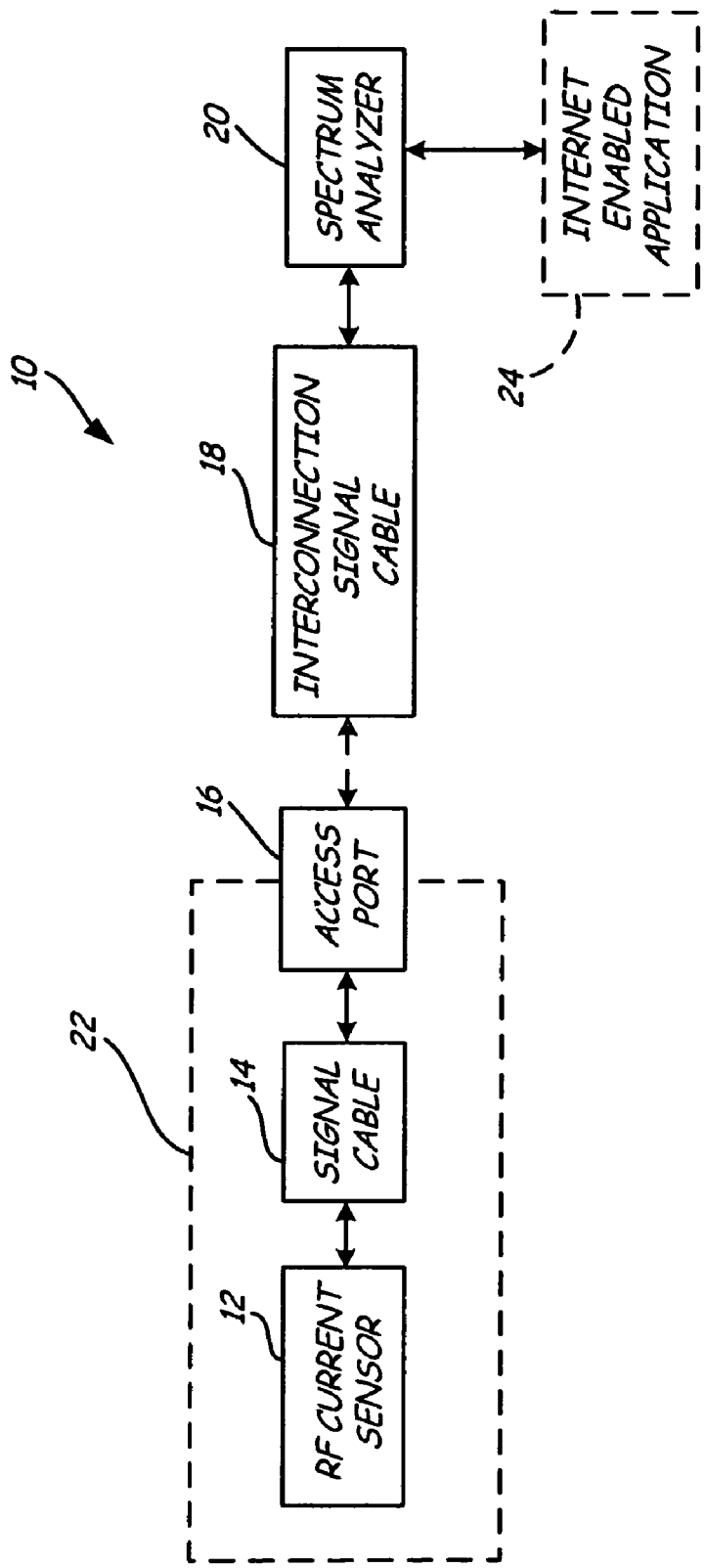
FIG. 1 is a block diagram of a partial discharge sensing system according to the present invention.

FIG. 1 is a block diagram of a partial discharge sensing system 10 that includes a RF current sensor 12, a signal cable 14, an access port 16, an interconnection signal cable 18, and a spectrum analyzer 20. The RF current sensor 12 is permanently installed at a location inside an enclosure 22. The signal cable 14 (e.g., a standard female—female coaxial cable) connects the RF current sensor 12 and the access port 16. The access port 16 is a bulkhead connector (e.g., a standard male—male coaxial cable connector) mounted on the enclosure 22 and extending through a wall or door thereof. The access port 16 can include a cover (not shown) for covering the exterior side when not in use.

The interconnection signal cable 18 (e.g., a standard female—female coaxial cable) is capable of being temporarily connected between the access port 16 and the spectrum analyzer 20. In this embodiment, the spectrum analyzer 20 need not be permanently connected to the RF current sensor 12. The RF current sensor 12 can remain permanently installed inside the enclosure 22 and the spectrum analyzer 20 can be connected only when testing is desired. This configuration allows online partial discharge testing (i.e., partial discharge testing conducted on test locations that are energized during testing) to be conducted without requiring technicians administering such tests to open or otherwise reach inside the enclosure 22 to position the RF current sensor 12. The safety of the system is enhanced by limiting the risk of electrical shock, electrocution, and other serious injury to technicians from equipment housed within the enclosure 22.

Data collected with the spectrum analyzer 20 can be used to assess the condition of equipment, and electrical wiring, at the location of the RF current sensor 12. When the spectrum analyzer 20 is temporarily connected, test data can be collected in a known manner. Analysis of such data can be used, for instance, to detect deterioration of insulation of power cables by detecting high frequency currents that are created when small gaps, voids or other deteriorations form in power cable insulation.

Optionally, an Internet-enabled application 24 on a computer (e.g., a laptop computer) can be provided with the spectrum analyzer 20. Online monitoring systems, such as the AMS™ Suite asset management system available from Emerson Process Management, Columbus, Ohio, can be linked to the sensing system 10 to obtain data from the spectrum analyzer 20 via the Internet-enabled application 24, where such data can be combined with data from other sources. The system of the present invention enables online partial discharge test data to be used to monitor data from a variety of sources, such as multiple partial discharge sensing systems 10 in different locations or through the integration of multiple types of data. This enables facility management to better monitor and control equipment in a facility without requiring time-consuming temporary sensor installation procedures. Application 24 can further provide an alert or alarm to indicate sensed faults at the location of the RF current sensor 12.

Figure 2:
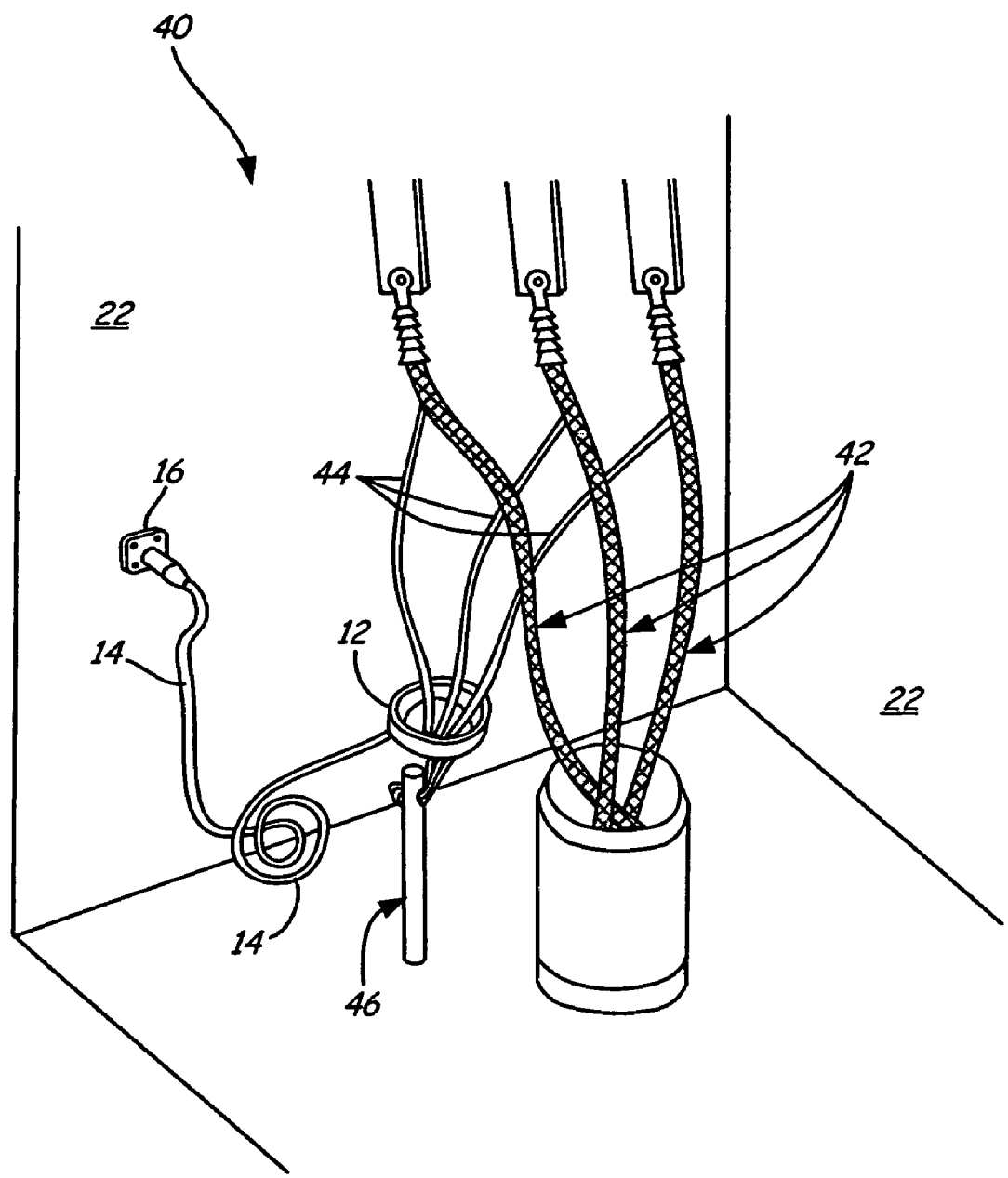
FIG. 2 is a perspective view of a portion of a partial discharge sensing system according to the present invention installed in an equipment enclosure.

FIG. 2 is a perspective view of a portion of a partial discharge sensing system 40, shown from inside an equipment enclosure 22. The system includes a partial discharge sensor 12, a signal cable 14, and a bulkhead connector providing and access port 16. A number of electrical cables 42, for instance, insulated power cables, are at least partially disposed in enclosure 22. A corresponding number of metallic shields or grounding wires 44 extend from the electrical cables 42 to ground 46. The partial discharge sensor 12 is positioned at a testing location relative to metallic shields or the grounding wires 44. The signal cable 14 connects the partial discharge sensor 12 and the access port 16, which allows for connection to the partial discharge sensor 12 from the exterior of the enclosure 22.

The partial discharge sensor 12 can be an RF current transformer sensor that is generally formed with a central opening for accepting wires or cables to be tested, and can be, for example, a fixed aperture current sensor available from Fischer Custom Communications, Inc., Torrance, Calif. The particular size of the sensor 12 can be selected according to the desired application. The sensor 12 is capable of detecting RF surface currents at the testing location, and can be calibrated to detect current signals in a range of about 100 kHz to about 400 MHz, or in a more focus range, as desired. The sensor 12 has a connector (e.g., an RF output connector Type N) for interfacing with the signal cable 14.

It should be recognized that the present invention provides a system and method for partial discharge testing of items, such as power cables, located at least partially within an enclosure without requiring an operator to enter that enclosure. The operator can remain at a safe distance from power cables that remain energized during partial discharge tests. Moreover, the present invention permits a sensor to be installed within an enclosure and a portable spectrum analyzer to be connected only when testing is desired.

Although the present invention has been described with reference to preferred embodiments, workers skilled in the art will recognize that changes may be made in form and detail without departing from the spirit and scope of the invention. For instance, it will be understood that other types of sensor installation configurations are possible, multiple sensors can be installed within an enclosure, and partial discharge testing can be conducted at a variety of desired testing locations according to the present invention.

The invention claimed is:

1. A partial discharge sensing system for conducting testing inside an enclosure, the system comprising:

a partial discharge sensor permanently installed at a test location inside the enclosure, wherein the test location is defined proximate to an electrical conductor extending through an interior portion of the enclosure, and wherein the partial discharge sensor is configured to encircle the electrical conductor;

an access port located on a wall of the enclosure, wherein the access port is configured to provide an electrical connection interface accessible from outside the enclosure to which an analyzer located outside the enclosure is removably connected; and a signal cable operably connecting the partial discharge sensor and the access port, enabling the analyzer removably connected to the access port from outside the enclosure to interface with the partial discharge sensor for generating test data.

2. The system of claim 1 and further comprising means for importing the test data to an Internet-enabled application.

3. The system of claim 1, wherein the analyzer is operably connected to the access port with a temporary interconnecting signal cable.

4. The system of claim 1, wherein the partial discharge sensor is a RF current sensor.

5. The system of claim 1, wherein the access port is configured such that the analyzer can be temporarily operably connected to the partial discharge sensor via the access port without the enclosure being opened.

6. The system of claim 1, wherein the electrical conductor comprises a grounding wire extending from an insulated electrical cable.

7. The system of claim 1, wherein the test location is defined proximate to a plurality of electrical conductors extending within the enclosure.

8. The system of claim 1, wherein the partial discharge sensor encircles a plurality of electrical conductors.

9. The system of claim 1, wherein the partial discharge sensor is in physical contact with the electrical conductor.

* * * * *

UNITED STATES PATENT AND TRADEMARK OFFICE
CERTIFICATE OF CORRECTION

| | |
|---|---|
| PATENT NO. | : 7,183,776 B1 |
| APPLICATION NO. | : 11/217065 |
| DATED | : February 27, 2007 |
| INVENTOR(S) | : Clarence A. Hicks et al. |

It is certified that error appears in the above-identified patent and that said Letters Patent is hereby corrected as shown below:

Column 4, Line 21, delete "analyzer can be", insert --analyzer is--

Signed and Sealed this

Eighth Day of May, 2007

JON W. DUDAS
*Director of the United States Patent and Trademark Office*